United States Patent
Ho et al.

(10) Patent No.: US 6,204,562 B1
(45) Date of Patent: Mar. 20, 2001

(54) WAFER-LEVEL CHIP SCALE PACKAGE

(75) Inventors: Kai-Kuang Ho, Feng-Shan; Te-Sheng Yang, Taipei, both of (TW)

(73) Assignee: United Microelectronics Corp. (TW)

( * ) Notice: Subject to any disclaimer, the term of this patent is extended or adjusted under 35 U.S.C. 154(b) by 0 days.

(21) Appl. No.: 09/249,583

(22) Filed: Feb. 11, 1999

(51) Int. Cl.$^7$ .......................... H01L 23/48; H01L 23/52; H01L 29/40
(52) U.S. Cl. .......................... 257/777; 257/778; 257/787; 257/723; 257/775
(58) Field of Search .................... 257/777, 778, 257/787, 723, 775; 438/613, 108, 638

(56) References Cited

U.S. PATENT DOCUMENTS

| | | | |
|---|---|---|---|
| 5,760,478 | * | 6/1998 | Bozso et al. .......................... 257/777 |
| 5,790,384 | * | 8/1998 | Ahmad et al. ....................... 361/768 |
| 5,798,567 | * | 8/1998 | Kelly et al. ........................... 257/723 |
| 5,804,882 | * | 9/1998 | Tsukagoshi et al. ................. 257/783 |
| 5,869,894 | * | 2/1999 | Degani et al. ....................... 257/723 |
| 5,939,783 | * | 8/1999 | Laine et al. .......................... 257/702 |
| 5,977,640 | * | 11/1999 | Bertin et al. ........................ 257/777 |

FOREIGN PATENT DOCUMENTS 5-129516 * 5/1993 (JP) ..................................... 257/777

* cited by examiner

*Primary Examiner*—Mahshid Saadat
*Assistant Examiner*—Jhihan B. Clark
(74) *Attorney, Agent, or Firm*—Blakely Sokoloff Taylor & Zafman

(57) ABSTRACT

A wafer-level chip scale package. The structure is applicable in packing at least two dies into a same package. The volume of the package is approximately equal to the total volume of the packed dies. A first die is provided. A pad redistribution step is performed on the first chip. Using flip chip technique, a second die is connected onto the first die. The first die has a surface area larger than that of the second die. Using a molding process, a molding material is infilled into spaces between the first and the second die. In addition, bumps are formed on the first chip with one ends thereof exposed and the other part covered by the molding material. Solder balls are formed on the exposed end of the bumps as terminals to electrically connect an external circuit or device.

10 Claims, 2 Drawing Sheets

WAFER-LEVEL CHIP SCALE PACKAGE

BACKGROUND OF THE INVENTION

1. Field of the Invention

The invention relates to a semiconductor packaging structure, and more particularly, to a structure of wafer-level chip scale package (CSP).

2. Description of the Related Art

As the technology of semiconductor fabrication grows more and more advanced, the relevant techniques have to be further developed to coordinate the requirements of the semiconductor devices. The fabrication process of a semiconductor device typically includes three stages. In the first stage, an epitaxy technique is used for the formation of a semiconductor substrate. Semiconductor devices such as metal-oxide semiconductor (MOS) and multilevel interconnection are fabricated on the substrate in the second stage. The third stage is the packaging process. It is now a leading trend for fabricating a device or an electronic product with a thin, light, and small dimension, that is, with a higher integration for semiconductor devices. In terms of packages, many techniques such as chip scale package, multi-chip module (MCM) have been developed to obtain a high integration. The development of the fabrication technique with a line width of 0.18 μm has evoked a great interest and intensive research to further decrease the package volume. It is thus one of the very important package techniques to arrange more than one chips into a single package. In a multi-chip package, chips of processor, memory, including dynamic random access memory (DRAM) and flash memory, and logic circuit can be packed together in a single package to reduce the fabrication cost and the packaging volume. Furthermore, the signal transmission path is shortened to enhance the efficiency. The multi-chip IC packaging technology may also be applied to a multi-chip system with variable functions and operation frequencies, for example, 1. A system comprises memory chips, microprocessors, resistors, capacitors, and inductors.

2. A system comprises memory chips (DRAM), logic circuit chips, and memory chips (Flash memory), 3. A system comprises analog chips, logic circuit chips, memory chips (including DRAM, SRAM, Flash memory), resistor, capacitor, and inductor.

In FIG. 1, a conventional dual-chip module is shown. A substrate 10 comprising a copper pattern 12 is provided. By means of the formation of solder balls 14, the electrical connection to an external device or circuit is established. A very popular material of the substrate is polymide. A die 16 with a larger size is adhered onto the substrate 10 with an insulating layer 16 as a glue layer in between. An insulating layer 20 and a die 22 with a smaller size is then disposed on the insulating layer 16. Conductive wires 24 are formed to electrically connect the dies 18, 22 and the substrate 10. Using resin 26, the dies 18 and 22 and the substrate 10 are molded. The electrical connection between the whole package and a printed circuit board can be achieved by ball grid array (BGA) which use solder balls 14 to connect the terminals on the printed circuit board. The drawback of this conventional dual-chip module includes a large surface is occupied since dies are packaged on a same side of surface. The thickness of the package is as thick as 1.4 mm, therefore, the volume of the package is large, and the signal transmission path between chips is long.

To further shrink the volume of package, a face to face multi-chip package is disclosed in U.S. Pat. No. 5,331,235. This multi-chip package uses tape automatic bonding technique. The electrical connection between chips and printed circuit board is achieved by the installation of a lead frame or other carriers. The signal transmission path is lengthened. In addition, a large thickness and surface area are resulted by using the molding material (resin) of package. The applicability is reduced, and the heat dissipation is not effective. Moreover, this kind of package can not be applied to high frequency products.

SUMMARY OF THE INVENTION

The invention provides a wafer-level chip scale package. Flip chip technique is adapted for connecting dies without using a carrier. Thus, the volume occupied by the carrier in the conventional structure is saved. The molding material is only infilled into the spaces between the dies, that is, a bare wafer molding type is used. The size of the package is thus further reduced. More specifically, the thickness of the package is approximately the same as the total thickness of the dies packed into the package, and the surface area of the package is about the same of that of the die with a larger surface area in the package.

In addition, using the application of flip chip technique to achieve the electrical connection between the dies does not require the formation of any additional bonding wires or other conductive paths. The electrical connection between the dies and an external device or circuit can be performed by the bumps formed on the larger die in the package. Thus, a short and direct signal transmission path is provided to enhance the performance of the chips.

Moreover, since a bare wafer molding type is used, the wafer-level chip scale package mentioned above has an enhanced performance of heat dissipation.

To achieve the above-mentioned objects and advantages, a wafer-level chip scale package is provided. The package comprises at least a larger die and a smaller die compared to each other in size. The larger die comprises a pad redistribution layer and bumps formed on a peripheral region of the pad redistribution layer. The smaller die is adhered onto a central region of the pad redistribution layer of the larger die by flip chip technique. The package further comprises a molding material infilled between the larger and the smaller dies and covering one side of each of the dies, with one end of the bumps exposed. Solder balls are then formed on the exposed end of the bumps. The fixture of the package is enhanced by the molding material.

In an embodiment which is to be introduced in more details in the following paragraphs, solder balls or bumps are formed on the pad distribution. The electrical connection between the larger die and the smaller die can be achieved by the formation of these solder balls or the bumps. These solder balls are typically very small in size and negligible. Thus, the resultant thickness is not increased thereby.

Both the foregoing general description and the following detailed description are exemplary and explanatory only and are not restrictive of the invention, as claimed.

DESCRIPTION OF THE PREFERRED EMBODIMENTS

Figure 1:
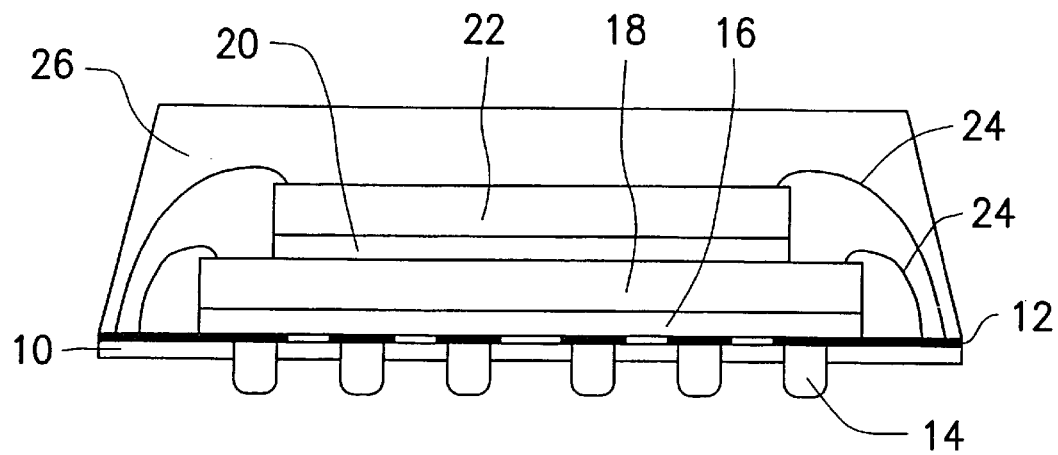
FIG. 1 shows a conventional dual-chip module package.
Figure 2:
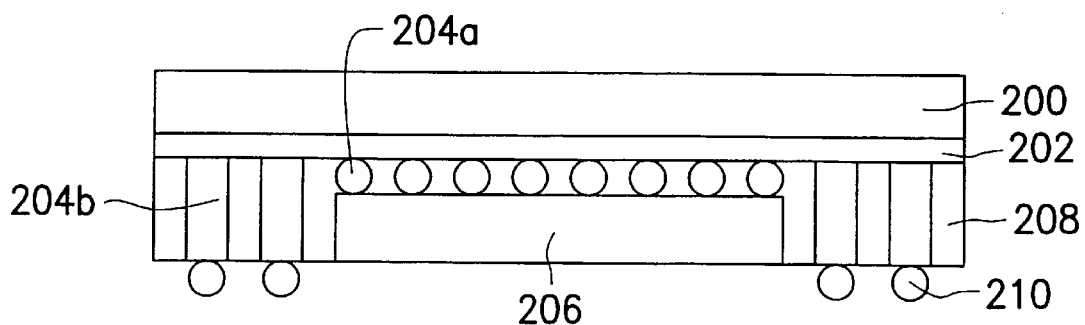
FIG. 2 is a cross sectional view showing a wafer-level chip scale package according to an embodiment in the invention.

In FIG. 2, a cross sectional view of a wafer-level chip scale package drawn according to an embodiment in the invention is presented. The wafer-level chip scale package comprises two dies 200, 206 with two different sizes. For example, the dies 200, 206 can be a dynamic random access memory (DRAM), a static random access memory (SRAM), a read only memory (ROM), a logic circuit, a flash memory, an application specific integrated circuit (ASIC), or an analog circuit. The connection of the dies 200 and 206 does not require a carrier, so that the package has a thickness approximately equal to a total thickness of the dies 200 and 206. Using flip chip technique, the electric or the signal conductive path is shortened, and thus, the package is applicable to high frequency devices.

A pad redistribution step is performed on the die 200 to rearrange the input/output (I/O) distribution. A pad redistribution layer 202 is thus formed on the die 200. Bumps 204*b* are formed on a peripheral region of the pad redistribution layer 202. Using flip chip technique, the die 206 is disposed onto the pad redistribution layer 202 and connected to the die 200. Preferably, bumps or solder balls 204*a* are formed between the dies 200 and 206 to achieve the electrical connection. As shown in the figure, the bumps 204*a* are formed with a height negligible so that the thickness of the package is not thickened thereby. Whereas, the bumps 204*b* are formed with a thickness approximately the same as the thickness of the die 206. Or more specifically, the thickness of the bumps 204*b* is equal to the total thickness of the bumps 204*a* and the die 206.

A molding material 208 is then infilled between the dies 200, 206, so as to cover the pad redistribution layer 202 and a surface of the die 206. The thickness of the molding material 208 thus depends on the surface profile of the die 200. In the peripheral region having the bumps 204*b*, the molding material 208 has a maximum thickness that is about the same of the height of the bumps 204*b*, so that one end of each 204*b* is exposed. As shown in the figure, the molding material 208 is formed and infilled between the dies 200, 206, and the bumps 204*a*, 204*b*. An improved fixture is obtained, and the elements such as the bumps 204*a* and 204*b*, or any circuit or device formed on the covered surfaces of the dies 200 and 206 can be protected without increasing the package thickness.

A solder ball 210 is formed on the exposed end of each bump 204*b* as a terminal to electrically connect an external device or circuit. In addition, the die 200 may be one of a wafer comprising many dies. That is, a die 206 is disposed on each die 200 on a wafer. After the above package process, a die sawing step is performed on the wafer to obtain many packages. Moreover, the invention can also be applied to pack more than two dies into a package, for example, as specific requirements, more than one smaller dies may be disposed and connected onto a larger die.

Figure 3:
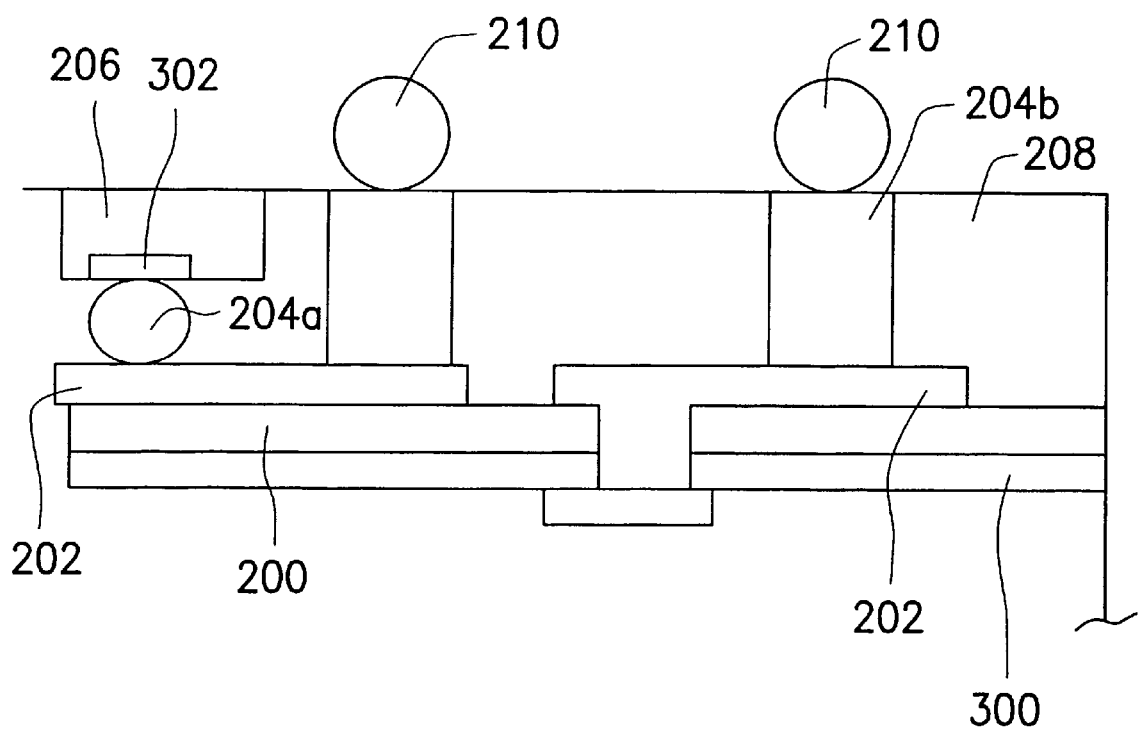
FIG. 3 is an enlarged view showing the die connection in FIG. 2.

FIG. 3 shows an example of the connection status and the connection structure between the dies 200 and 206. The die 200 is carried by an insulator 300, for example, a polymide layer. According to the specific requirements, a pad redistribution layer 202 is designed and formed. Bumps 204*a* and 204*b* are formed on a peripheral region of the pad redistribution layer 202. The bumps 204*a* comprises soldering balls or conductors in other shape, while the bumps 204*b* comprises metal posts as shown in the figure. The die 206 is connected to the die 200 via the bumps 204*a* and a pad 302 on the die 206. A protection layer 208 is formed using a molding process. The bumps 208*b* each has one end connected to a solder ball 210 to provide a conductive path to an externally device or circuit.

The invention thus provides a chip scale package comprising at least the following advantages:

1. The dies are connected to each other by employing the flip chip technique instead of the conventional bonding step. The electrical connection between the dies in the package and the external circuit or chips are achieved by the formations of the bumps with a height approximately equal to the thickness of the smaller die. Thus, the signal or electricity transmission is greatly shortened. The LCR delay time can thus be effectively reduced, so that the package provided in the invention is applicable to high frequency devices.

2. The thickness of the package is about the same as the total thickness of two dies. In an example of the invention, the thickness of the package is designed as thin as 0.8 mm. As mentioned above, the thickness of the package is no less than 1.4 mm. Therefore, compared to the conventional structure, the ratio of the package thickness to the total thickness of the dies is reduced from 1:2 to 1:1. Again, the objective to make a semiconductor product toward a further light, thin, short, and small is achieved.

3. In the invention, a bare wafer molding type package is adapted. Thus, the heat can be directly dissipated from the bare side of the dies.

Other embodiments of the invention will appear to those skilled in the art from consideration of the specification and practice of the invention disclosed herein. It is intended that the specification and examples to be considered as exemplary only with a true scope and spirit of the invention being indicated by the following claims.

What is claimed is:

1. A wafer package, comprising:
   a first die, further comprising:
   a pad redistribution layer thereon; and
   at least a bump in a peripheral region of the pad redistribution layer;
   a second die, disposed on a central region of the pad redistribution layer using flip chip technique;
   a molding material, infilled into spaces between the pad redistribution layer and the second die, and covering a surface of the second die and the pad redistribution layer with one end of the bump exposed, wherein the molding material has a thickness of which a maximum value is about the same as a thickness of the second die;
   a solder ball, connected on the exposed end of the bump.

2. The package according to claim 1, wherein the first die having a surface area larger than a surface area of the second die.

3. The package according to claim 1, wherein the bump has a height about the same of a thickness of the second die.

4. A wafer-level package, comprising:
   a first die, further comprising:
   a pad redistribution layer thereon; and
   a plurality of first bump on the pad redistribution layer; and
   a plurality of second bumps on the pad redistribution to circumscribe the first bumps;
   a second die, connected to the first bumps and circumscribed by the second bumps;
   a molding material, infilled into spaces between the first die and the second die, covering the pad redistribution layer and a surface of the second die connecting to the first bumps, and with one end of each of the second bumps exposed, wherein the molding material has a thickness of which a maximum value is about the same as a thickness of the second die; and
   a plurality of soldering balls, connected on the exposed ends of the second bumps.

5. The package according to claim 4, wherein the first die has a surface area larger than a surface area of the second die.

6. The package according to claim 4, the each of the first bumps is small enough so that the thickness of the package is about the same as the total thickness of the first die and the second die.

7. The package according to claim 4, wherein each of the second bumps has a height as larger as the thickness of the second die.

8. The package according to claim 4, wherein each of the second bumps has a height equal to a sum of a height of each of the first bumps and a thickness of the second die.

9. The package according to claim 4, wherein the first bumps comprises a plurality of soldering balls.

10. The package according to claim 4, wherein the second bumps comprises a plurality of metal posts.

* * * * *